United States Patent
Yamazaki

(10) Patent No.: US 9,028,611 B2
(45) Date of Patent: May 12, 2015

(54) METHOD FOR PRODUCING GROUP III NITRIDE SEMICONDUCTOR

(75) Inventor: Shiro Yamazaki, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 1153 days.

(21) Appl. No.: 12/926,995

(22) Filed: Dec. 22, 2010

(65) Prior Publication Data

US 2011/0155046 A1    Jun. 30, 2011

(30) Foreign Application Priority Data

Dec. 25, 2009   (JP) ................................. 2009-295619

(51) Int. Cl.
| | |
|---|---|
| *C30B 19/10* | (2006.01) |
| *C30B 19/04* | (2006.01) |
| *C30B 29/40* | (2006.01) |
| *C30B 9/10* | (2006.01) |
| *C30B 19/02* | (2006.01) |
| *C30B 9/06* | (2006.01) |

(52) U.S. Cl.
CPC ............... *C30B 29/403* (2013.01); *C30B 19/04* (2013.01); *C30B 9/06* (2013.01); *C30B 9/10* (2013.01); *C30B 19/02* (2013.01); *C30B 29/406* (2013.01)

(58) Field of Classification Search
CPC .... C30B 19/02; C30B 29/403; C30B 29/406; C30B 9/10
USPC ............................................... 117/56, 73, 74
See application file for complete search history.

(56) References Cited

U.S. PATENT DOCUMENTS

| | | | |
|---|---|---|---|
| 6,979,584 B2 | 12/2005 | Koike et al. | |
| 7,524,691 B2 | 4/2009 | Kitaoka et al. | |
| 7,560,725 B2 | 7/2009 | Koike et al. | |
| 2003/0092263 A1 | 5/2003 | Koike et al. | |
| 2004/0089919 A1* | 5/2004 | Motoki et al. | ................ 257/613 |
| 2004/0147096 A1* | 7/2004 | Kitaoka et al. | ................ 438/483 |

(Continued)

FOREIGN PATENT DOCUMENTS

| | | |
|---|---|---|
| CN | 1413357 A | 4/2003 |
| CN | 1429401 A | 7/2003 |

(Continued)

OTHER PUBLICATIONS

Chinese Office Action dated Feb. 11, 2015 with an English translation thereof.

*Primary Examiner* — Bob M Kunemund
*Assistant Examiner* — Hua Qi
(74) *Attorney, Agent, or Firm* — McGinn IP Law Group, PLLC

(57) ABSTRACT

A method for producing a Group III nitride semiconductor includes reacting a molten mixture containing at least a Group III element and an alkali metal with a gas containing at least nitrogen, to thereby grow a Group III nitride semiconductor crystal on the seed crystal. The method includes forming a template substrate including a sapphire substrate and a first Group III nitride semiconductor layer as the seed crystal which is formed by vapor phase growth and which includes a c-plane as a main plane is employed, and the template substrate is placed and maintained in the molten mixture under conditions where crystal growth of the Group III nitride semiconductor is inhibited, to thereby partially melt back a plurality of separated parts of the first Group III nitride semiconductor layer to such a depth that the sapphire substrate is partially exposed.

20 Claims, 3 Drawing Sheets

(56) References Cited

U.S. PATENT DOCUMENTS

| | | |
|---|---|---|
| 2004/0183090 A1 | 9/2004 | Kitaoka et al. |
| 2005/0059229 A1* | 3/2005 | Minemoto et al. ............ 438/602 |
| 2006/0027831 A1 | 2/2006 | Kioke et al. |
| 2011/0155046 A1 | 6/2011 | Yamazaki |

FOREIGN PATENT DOCUMENTS

| | | |
|---|---|---|
| CN | 1664179 A | 9/2005 |
| CN | 1954101 A | 4/2007 |
| CN | 101393958 A | 3/2009 |
| CN | 101432471 A | 5/2009 |
| CN | 101558187 A | 10/2009 |
| CN | 101925696 A | 12/2010 |
| EP | 1576210 B1 | 2/2010 |
| JP | 2004-247711 A | 9/2004 |
| JP | 2006-169024 A | 6/2006 |
| JP | 2010-171273 A | 8/2010 |
| WO | WO 03/072856 A1 | 9/2003 |

* cited by examiner

METHOD FOR PRODUCING GROUP III NITRIDE SEMICONDUCTOR

BACKGROUND OF THE INVENTION

1. Field of the Invention

The present invention relates to a method for producing a Group III nitride semiconductor by the flux method. More particularly, the invention relates to a method of separating a Group III nitride semiconductor layer from a sapphire substrate while cracking of the Group III nitride semiconductor layer grown by the flux method is prevented, in the case where a template substrate formed of the sapphire substrate and the Group III nitride semiconductor layer is employed as a seed crystal.

2. Background Art

The Na flux method is a known method for producing a Group III nitride semiconductor such as GaN. In this method, a molten mixture of Na (sodium) and Ga (gallium) is reacted with nitrogen at about 800° C. and a pressure of some ten atmospheres, to thereby grow GaN crystals.

The Na flux method employs, as a seed crystal, for example, a template substrate formed of a sapphire substrate and a GaN layer grown thereon by HVPE, or a GaN substrate.

Japanese Patent Application Laid-Open (kokai) No. 2006-169024 discloses a method for growing a Group III nitride crystal, which method includes employing a GaN substrate as a seed crystal; placing the seed crystal in a molten mixture of Na and Ga at such a temperature and a pressure that crystal growth of GaN is inhibited, to thereby melt back a part of the surface of the GaN substrate and form grooves; and subsequently, growing a GaN crystal on the GaN substrate at such a temperature and a pressure that crystal growth of GaN is allowed, to thereby fill the grooves with the molten mixture. In this method, since the grooves are filled with the molten mixture, the heat radiation performance of the GaN crystal is effectively improved.

Japanese Patent Application Laid-Open (kokai) No. 2004-247711 discloses a method for producing a Group III nitride free-substrate, which method includes employing, as a seed crystal, a template substrate formed of a sapphire substrate and a stripe-pattern GaN layer formed thereon; growing GaN on the a stripe-pattern GaN layer through the Na flux method; and subsequently, cooling the stacked product, to thereby generate stress attributable to the difference in linear expansion coefficient between sapphire and GaN and separate the seed crystal, whereby a high-quality GaN free-standing substrate is produced. The patent document also discloses that the stripe-pattern GaN layer may be formed through dry-etching a part of the GaN layer to such a depth that the surface of the sapphire substrate is exposed.

However, the second method is very cumbersome, since the method includes the dry-etching step of forming the stripe-pattern GaN layer and the step of growing GaN crystal by the Na flux method, separately.

SUMMARY OF THE INVENTION

In view of the foregoing, an object of the present invention is to readily produce a high-quality Group III nitride semiconductor substrate by the method for producing a Group III nitride semiconductor by the flux method employing a template substrate as a seed crystal.

Accordingly, in a first aspect of the present invention, there is provided a method for producing a Group III nitride semiconductor, including reacting a molten mixture containing at least a Group III element and an alkali metal with a gas containing at least nitrogen, to thereby grow a Group III nitride semiconductor crystal on the seed crystal, wherein the method comprises:

a first step in which a template substrate formed of a sapphire substrate and a first Group III nitride semiconductor layer which is formed on the sapphire substrate by vapor phase growth and which has a c-plane as a main plane is employed as the seed crystal; and the template substrate is placed and maintained in the molten mixture under the conditions where crystal growth of the Group III nitride semiconductor is inhibited, to thereby melt back a part of the first Group III nitride semiconductor layer to such a depth that the sapphire substrate is exposed, so that the remaining part of the first Group III nitride semiconductor layer is left in the form of a plurality of upright columns;

a second step subsequent to the first step in which a second Group III nitride semiconductor layer having a c-plane as a main plane is grown on the first Group III nitride semiconductor layer under the conditions where crystal growth of the Group III nitride semiconductor is permitted, so that the spaces between the columns are not filled with the second Group III nitride semiconductor; and a third step subsequent to the second step in which cracking is induced in the first Group III nitride semiconductor layer through lowering of temperature, to thereby separate the second Group III nitride semiconductor layer from the sapphire substrate.

As used herein, the term "Group III nitride semiconductor" refers to a semiconductor represented by $Al_xGa_yIn_zN$ ($x+y+z=1$, $0 \le x, y, z \le 1$) and also encompasses those in which Al, Ga, and In atoms are partially substituted by another group 13 element (Group 3B element) such as B or Tl, and N atoms are partially substituted by another group 15 element (Group 5B element) such as P, As, Sb, or Bi. More specifically, the semiconductor is a semiconductor essentially containing Ga; i.e., GaN, InGaN, AlGaN, or AlGaInN.

The Group III element is at least one species selected from Ga, Al, and In. Particularly, the second Group III nitride semiconductor layer is preferably GaN containing only Ga as a Group III element. The chemical composition of the first Group III nitride semiconductor layer is preferably the same as that of the second Group III nitride semiconductor layer.

The alkali metal is generally Na (sodium), but K (potassium) or a mixture of Na and K may be used. Alternatively, the alkali metal may contain Li (lithium) or an alkaline earth metal. The molten mixture may contain a dopant for controlling physical properties (e.g., conduction type or magnetic property) of Group III nitride semiconductor to be grown, promoting crystal growth, preventing formation of miscellaneous crystals, controlling the growth direction, etc. For example, when C (carbon) is added, formation of miscellaneous crystals can be prevented, and crystal growth can be promoted. As an n-type dopant, Ge (germanium) or the like may be used, and as a p-type dopant, Zn (zinc) or the like may be used.

The gas containing nitrogen is a gas of nitrogen molecules, a gas of a compound containing nitrogen as a component element (e.g., ammonia), a mixture thereof, or a mixture with inert gas such as rare gas.

The percent area of the first Group III nitride semiconductor layer in the form of a plurality of upright columns in the sapphire substrate surface is preferably 50% or more and less than 100%. When the percent area falls within the above range, there can be produced a high-quality second Group III nitride semiconductor layer in which cracking is more effectively prevented.

Whether the crystal growth of the Group III nitride semiconductor is permitted or not is determined by factors such as the temperature of molten mixture, the pressure, and the saturation state of nitrogen in the molten mixture. By controlling the factors, the conditions under which crystal growth of Group III nitride semiconductor is inhibited (first step) can be changed to those under which crystal growth of Group III nitride semiconductor is permitted (second step).

Particularly when the temperature of the molten mixture in which the first Group III nitride semiconductor layer is melted back in the first step is equalized to the temperature of the molten mixture in which the second Group III nitride semiconductor layer is grown through the flux method in the second step; the pressure in the first step is adjusted to be lower than the pressure at which the Group III nitride semiconductor is grown; and the pressure is elevated in the second step so as to allow crystal growth of the Group III nitride semiconductor, the first step can be shifted to the second step by controlling only pressure without controlling temperature, whereby the production steps can be further streamlined.

Also, when the pressure at which the first Group III nitride semiconductor layer is melted back in the first step is equalized to the pressure at which the second Group III nitride semiconductor layer is grown by the flux method in the second step; the temperature of the first step is adjusted to be higher than the crystal growth temperature of the Group III nitride semiconductor; and the temperature is lowered in the second step to a temperature at which the Group III nitride semiconductor is grown, the first step can be shifted to the second step through controlling only temperature without controlling pressure, whereby the production steps can be further streamlined.

Alternatively, the nitrogen level of the molten mixture may be adjusted to a non-saturation level which is a level close to but under the saturation level (hereinafter may be referred to as a "sub-saturation level") in the first step, and then the nitrogen level of the molten mixture may be elevated to a super-saturation level by melting back the first Group III nitride semiconductor layer in the first step, whereby the conditions under which crystal growth of the Group III nitride semiconductor is permitted are attained. Through this alternative method, the first step can be shifted to the second step without controlling temperature or pressure, whereby the production steps can be further streamlined. Needless to say, the nitrogen-sub-saturation level may be shifted to the nitrogen-super-saturation level by controlling temperature and pressure. As used herein, a non-saturation level which is a level close to but under the saturation level, i.e., the sub-saturation level, means a starting nitrogen concentration level, where nitrogen is dissolved in the molten mixture at a level almost equal to the saturation level, in the first step and a level which reaches the saturation level when that the first Group III nitride semiconductor layer is not completely melted back and a plurality of upright columns are formed.

A second aspect of the invention is directed to a specific embodiment of the method for producing a Group III nitride semiconductor of the first aspect, wherein the second Group III nitride semiconductor layer is grown to a thickness of 0.5 mm or more.

A third aspect of the invention is directed to a specific embodiment of the method for producing a Group III nitride semiconductor of the first or second aspect, wherein the crystal growth of the Group III nitride semiconductor in the first step is inhibited by adjusting the pressure to be lower than the pressure at which crystal growth of the Group III nitride semiconductor is permitted, and the crystal growth of the Group III nitride semiconductor in the second step is permitted through elevating a pressure from of the pressure of the first-step to the pressure at which crystal growth of the Group III nitride semiconductor is permitted.

A fourth aspect of the invention is directed to a specific embodiment of the method for producing a Group III nitride semiconductor of the third aspect, wherein the molten mixture in the first step has a temperature which is equal to a temperature of the molten mixture of the second step.

A fifth aspect of the invention is directed to a specific embodiment of the method for producing a Group III nitride semiconductor of the first or second aspect, wherein the crystal growth of the Group III nitride semiconductor in the first step is inhibited through elevating a temperature of the molten mixture to be higher than a temperature at which crystal growth of the Group III nitride semiconductor is permitted, and the crystal growth of the Group III nitride semiconductor in the second step is permitted by lowering the temperature of the molten mixture in the first step to a temperature at which crystal growth of the Group III nitride semiconductor is permitted.

A sixth aspect of the invention is directed to a specific embodiment of the method for producing a Group III nitride semiconductor of the fifth aspect, wherein the first step employs a pressure which is equal to a pressure of the second step.

A seventh aspect of the invention is directed to a specific embodiment of the method for producing a Group III nitride semiconductor of the first or second aspect, wherein the crystal growth of the Group III nitride semiconductor in the first step is inhibited through adjusting a nitrogen level of the molten mixture to a non-saturation level which is a level close to but under the saturation level, and the crystal growth of the Group III nitride semiconductor in the second step is permitted by adjusting the nitrogen level of the molten mixture to a super-saturation level by melting back the first Group III nitride semiconductor layer in the first step.

According to the first aspect of the invention, the second Group III nitride semiconductor layer which has been grown by the flux method and which has a c-plane as a main plane can be readily separated from the sapphire substrate without generating cracks in the semiconductor layer.

According to the second aspect, the present invention is advantageous in the case where the second Group III nitride semiconductor layer is grown through the flux method to a thickness of 0.5 mm or more. When the thickness is 0.5 mm or more in a simple deposition, the stress generated due to the differences in linear expansion coefficient and lattice constant between sapphire and GaN increases, to thereby readily generate cracks in the GaN layer. However, according to the present invention, generation of cracks can be effectively prevented in the growing second Group III nitride semiconductor, whereby a crack-free second Group III nitride semiconductor layer having a thickness of 0.5 mm or more can be readily produced.

According to the third aspect of the invention, through controlling only pressure, the conditions where crystal growth of the Group III nitride semiconductor is inhibited can be shifted to the conditions where crystal growth of the Group III nitride semiconductor is permitted. Particularly, according to the fourth aspect of the invention, the first step can be shifted to the second step through controlling only pressure, whereby the production steps can be streamlined.

According to the fifth aspect of the invention, through controlling only the temperature of the molten mixture, the conditions where crystal growth of the Group III nitride semiconductor is inhibited can be shifted to the conditions where crystal growth of the Group III nitride semiconductor is permitted. Particularly, according to the sixth aspect of the invention, the first step can be shifted to the second step through controlling only temperature, whereby the production steps can be streamlined.

According to the seventh aspect of the invention, a nitrogen concentration of the molten mixture at a non-saturation level which is a level close to but under the saturation level is converted to a super-saturation level through melting back of the semiconductor layer, whereby the conditions where crystal growth of the Group III nitride semiconductor is inhibited can be shifted to the conditions where crystal growth of the Group III nitride semiconductor is permitted. Thus, the production steps can be streamlined.

DETAILED DESCRIPTION OF PREFERRED EMBODIMENTS

Figure 1A:
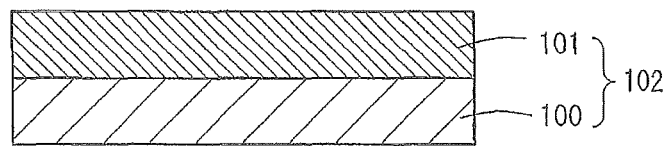
FIGS. 1A to 1D show the steps of producing a GaN crystal.

The present invention will next be described in detail with reference to the drawings attached hereinbelow, which should not be construed as limiting the invention thereto.

Embodiment 1

FIGS. 1A to 1D show the steps of producing a GaN crystal by the Na flux method performed in Embodiment 1. FIG. 2 shows an apparatus for producing the GaN crystal.

The configuration of the production apparatus will next be described. The production apparatus comprises a pressure container 10, a reaction vessel 11, a crucible 12, a heating apparatus 13, supply pipes 14, 16, and discharge pipes 15, 17.

The pressure container 10 is a pressure-resistant hollow cylinder made of stainless steel. To the pressure container 10, the supply pipe 16 and the discharge pipe 17 are connected. In the pressure container 10, the reaction vessel 11 and the heating apparatus 13 are disposed. The reaction vessel 11 has heat resistance. In the reaction vessel 11, the crucible 12 is placed. The crucible 12 holds a molten mixture containing Ga and Na, and a template substrate 102 is maintained in the molten mixture. To the reaction vessel 11, the supply pipe 14 and the discharge pipe 15 are connected. Through operation of valves (not illustrated) attached to the supply pipe 14 and the discharge pipe 15, there are performed aeration in and feeding nitrogen into the reaction vessel 11, and controlling the pressure inside the reaction vessel 11. Nitrogen is also supplied to the pressure container 10 via the supply pipe 16. Through operation of valves (not illustrated) attached to the supply pipe 16 and the discharge pipe 17, the nitrogen flow rate and discharge rate are controlled, whereby the pressure inside the pressure container 10 is equalized to that of the reaction vessel 11. The temperature inside the reaction vessel 11 is controlled by means of the heating apparatus 13.

Meanwhile, when the reaction vessel 11 has pressure resistance, the pressure container 10 is not necessarily employed.

The steps of producing a GaN crystal will next be described with reference to FIGS. 1A to 1D.

Figure 2:
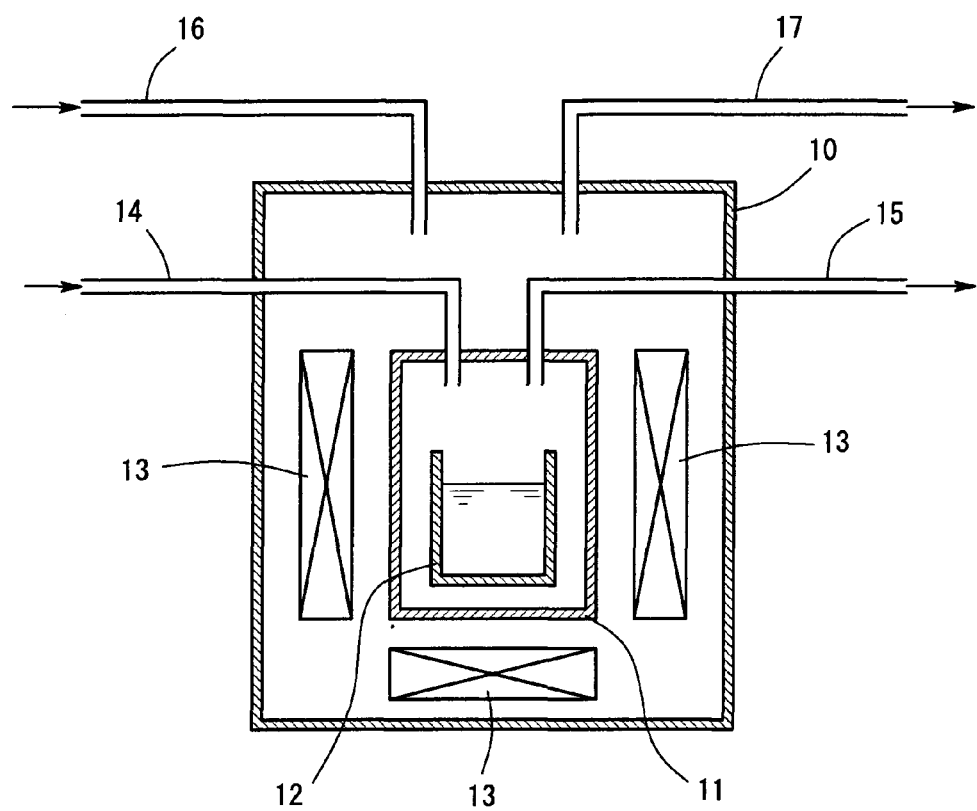
FIG. 2 is a cross-section of a production apparatus.

Firstly, a GaN layer 101 having a c-plane as a main plane was formed by HVPE on a sapphire substrate 100, to thereby provide a template substrate 102 (FIG. 1A). The GaN layer 101 has a thickness of 10 µm.

Then, the template substrate 102 was placed in the crucible 12 with Na, Ga, and C, such that the sapphire substrate 100 faces the bottom of the crucible 12. Na and Ga of the solid form may be placed in the crucible 12, or Na and Ga in the liquid form may be placed in the crucible 12. Alternatively, a mixture of Na liquid and Ga liquid may be fed to the crucible 12. C was added in order to promote crystal growth of GaN and prevent formation of miscellaneous crystals.

Figure 1B:
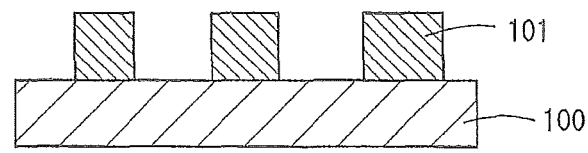

Subsequently, the crucible 12 was heated by means of the heating apparatus 13, to thereby form a Ga—Na molten mixture, and the temperature of the molten mixture was adjusted to 850° C. Nitrogen was fed into to the reaction vessel 11 via the supply pipe 14 and the discharge pipe 15, and the pressure inside the reaction vessel 11 was adjusted to 2.5 MPa. The template substrate 102 was maintained in the molten mixture. The temperature of the molten mixture was adjusted to permit crystal growth of GaN, but the pressure was adjusted to be lower than the pressure at which crystal growth of GaN is permitted. Thus, the GaN layer 101 was melted back. Melting back was performed until the surface of the sapphire substrate 100 was exposed. However, a part of the GaN layer 101 was not melted back to the surface of the sapphire substrate 100, whereby the GaN layer 101 remained as a plurality of upright columns (FIG. 1B). A conceivable reason for formation of such a plurality of upright columns of the GaN layer 101 is that a distribution in Ga concentration in the molten mixture contained in the crucible 12 provides variation in melting back rate.

Figure 1C:
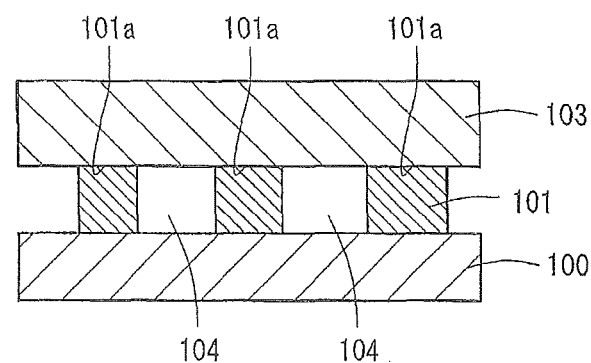

Then, while the molten mixture was maintained at 850° C., the inside of the reaction vessel 11 was pressurized to 4 MPa by controlling the nitrogen flow rate and discharge rate via the supply pipe 14 and the discharge pipe 15. Through this pressurization, both the temperature and pressure met the conditions where crystal growth of GaN is permitted. Through maintaining the temperature and pressure for 100 hours, a GaN layer 103 was grown on the GaN layer 101 to a thickness of 0.5 mm (FIG. 1C). Notably, the GaN layer 103 was grown without filling spaces 104 between upright columns of the GaN layer 101.

The feature of the growth is attained through the following conceivable mechanism. Specifically, the nitrogen concentration (level) of the molten mixture gradually increases toward the liquid surface (i.e., the interface between the molten mixture and nitrogen). Thus, within the entire surface of a column of the GaN layer 101, which surface is in contact with the molten mixture, the upper face 101a of the column of the GaN layer 101 is a part where the nitrogen concentration is higher than in the other parts. Accordingly, crystal growth of GaN starts in the vicinity of the upper face 101a of the GaN layer 101, and propagates from the start point as a nucleus in the plane direction of the template substrate 102 and in the vertical direction thereto. Once GaN is grown, the nitrogen concentration of the molten mixture is higher at the upper surface of the grown GaN layer than in the other parts. Thus, GaN is continue to grow on the upper face 101a of the GaN layer 101 but does not fill intercolumnar spaces 104. Eventually, GaN grown layers formed from a plurality of upper faces 101a are integrated, to thereby form the continuous GaN layer 103 having a c-plane as a main plane.

In this embodiment, the temperature of the molten mixture during melting back of the GaN layer 101 was adjusted to be equal to the temperature at which the GaN layer 103 was grown. However, so long as the temperature and pressure in a process of the melt back are set in a range in which GaN can be melted back and the temperature and pressure in a process of the crystal growth are set in a range in which GaN can be grown, the two temperatures of the two processes may be different from each other. However, by employment of the same temperature, the step of melting back the GaN layer 101 can be shifted to the step of growing the GaN layer 103 by controlling only pressure, whereby the production steps can be streamlined.

Figure 1D:
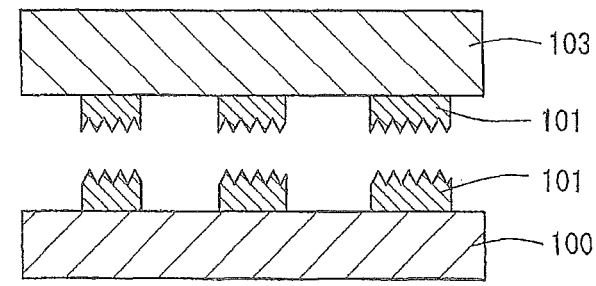

Subsequently, heating and pressurization were stopped, and the temperature and pressure were returned to ambient conditions, whereby crystal growth of the GaN layer 103 was terminated. In the course of lowering the temperature, stress was generated due to the differences in linear expansion coefficient and lattice constant between sapphire and GaN. The generated stress concentrated mainly in the GaN layer 101, to thereby generate cracks in the GaN layer 101. As a result, the sapphire substrate 100 was separated from the GaN layer 103 (FIG. 1D). Notably, since the stress generated due to the differences in linear expansion coefficient and lattice constant between sapphire and GaN does not concentrate in the GaN layer 103, cracking of the GaN layer 103 can be prevented.

Thereafter, the GaN layer 103 was removed from the substrate 100, and the parts of the GaN layer 101 remaining on the GaN layer 103 were removed through polishing, thereby yielding a high-quality GaN free-standing substrate free from cracking.

Embodiment 2

Figure 3A:
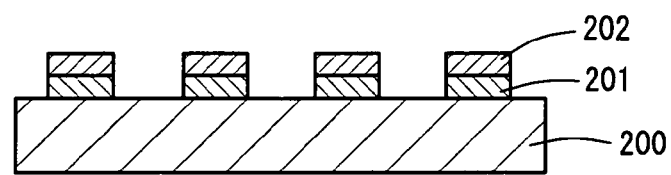
FIGS. 3A and 3B show the steps of preparing the template substrate.
Figure 3B:
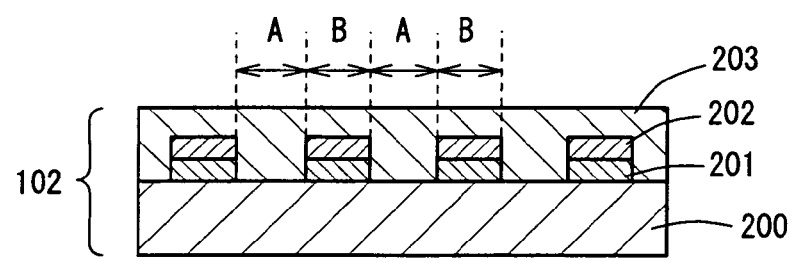

The embodiment 2 is related with a template substrate 102 used in the method of the present invention for producing a Group III nitride semiconductor. FIGS. 3A and 3B show the steps of preparing the template substrate 102. An AlN buffer layer 201 was uniformly formed on a sapphire substrate 200. Subsequently a GaN layer 202 with a thickness of 2 μm was uniformly formed on the AlN buffer layer 201. A photoresist was uniformly formed on the GaN layer 202. Subsequently a periodic pattern mask of the photoresist was formed on the surface of the GaN layer 202 by a photolithography. Next a maskless portion was dry etched until the sapphire substrate 200 was exposed as shown in FIG. 3A. After removing the mask and cleaning the substrate, a GaN layer 203 was grown again by HVPE or MOVPE as shown in FIG. 3B. In this way, the template substrate 102 was formed. The template substrate which is formed by such a process can be used as the template substrate 102 of the embodiment 1.

The steps of producing a GaN crystal by the Na flux method was performed by the same method as the embodiment 1 as shown in FIGS. 1A to 1D. The template substrate 102 of the FIG. 1A is corresponding to the template substrate 102 of the FIG. 3B.

The GaN layer grown on the sapphire substrate 200 exposed by dry etching had a high defect density, which was easier to be melted back than that grown on the remaining portion of the GaN layer 202 with a thickness of 2 μm. In FIG. 3B, the portion A of the GaN layer 203 has poor crystalline quality, which is easily etched. The portion B of the GaN layer 203 has superior crystalline quality, which is not easily etched, because the portion B of the GaN layer 203 is grown on the GaN layer 202 having superior crystalline quality formed on the AlN buffer layer 201.

In Embodiments 1 and 2, the thickness of the GaN layer 101 of the template substrate was adjusted to 10 μm. However, the thickness of the GaN layer 101 is preferably 5 to 30 μm. When the thickness is less than 5 μm, the GaN layer 101 might be completely melted back, whereas when the thickness is larger than 30 μm, an excessive period of time is required for melting back to expose the surface of the sapphire substrate 10. Thus, the thickness of the GaN layer 101 is more preferably 10 to 30 μm.

In Embodiments 1 and 2, the GaN layer 103 was grown to a thickness of 0.5 mm. The present invention is particularly advantageous in the case where the GaN layer 103 is grown to a thickness of 0.5 mm or more. Generally, when the thickness is 0.5 mm or more, the stress generated due to the differences in linear expansion coefficient and lattice constant between sapphire and GaN increases, to thereby readily generate cracks in the GaN layer 103. However, according to the present invention, generation of cracks can be effectively prevented.

In Embodiments 1 and 2, the temperature of the molten mixture during melting back of the GaN layer 101 was equalized to the temperature of the molten mixture during crystal growth of the GaN layer 103 by the flux method; the pressure during melting back of the GaN layer 101 was adjusted to be lower than the pressure during the crystal growth of GaN; and then the pressure was elevated to a pressure at which crystal growth of GaN is permitted, whereby the GaN layer 103 was grown. However, the following alternative methods may be employed.

In one alternative method, the pressure during melting back of the GaN layer 101 is equalized to the pressure during crystal growth of the GaN layer 103 by the flux method; the temperature of the molten mixture during melting back of the GaN layer 101 is adjusted to be higher than the temperature at which crystal growth of GaN is permitted; and then the temperature is lowered to a temperature at which crystal growth of GaN is permitted, whereby the GaN layer 103 is grown. Through employment of this alternative method, only temperature control is required without controlling pressure, whereby the production steps can be streamlined.

In another alternative method, the nitrogen concentration of the molten mixture is adjusted to a non-saturation level which is a level close to but under the saturation level at the start of melting back of the GaN layer 101; and then the nitrogen concentration of the molten mixture is adjusted to a super-saturation level by melting back of the GaN layer 101, whereby the GaN layer 103 is grown. Through employment of this alternative method, no control of temperature or pressure is required, whereby the production steps can be further streamlined.

Embodiments 1 and 2 are directed to a method for producing a GaN crystal. However, the present invention may be applicable to production of a Group III nitride semiconductor other than GaN such as AlGaN, InGaN, or AlGaInN.

The Group III nitride semiconductor produced according to the present invention may be employed as a substrate for producing Group III nitride semiconductor light-emitting devices or the like.

What is claimed is:

1. A method for producing a Group III nitride semiconductor, including reacting a molten mixture containing at least a Group III element and an alkali metal with a gas containing at least nitrogen, to thereby grow a Group III nitride semiconductor crystal on a seed crystal, wherein the method comprises:

a first step in which a template substrate comprising a sapphire substrate and a first Group III nitride semiconductor layer as the seed crystal which is formed by vapor phase growth and which includes a c-plane as a main plane is employed, and the template substrate is placed and maintained in the molten mixture under conditions where crystal growth of the Group III nitride semiconductor is inhibited, to thereby partially melt back a plurality of separated parts of the first Group III nitride semiconductor layer to such a depth that the sapphire substrate is partially exposed, so that a plurality of separated remaining parts of the first Group III nitride semiconductor layer are partially left in a form of a plurality of separated upright columns;

a second step subsequent to the first step in which a second Group III nitride semiconductor layer including a c-plane as a main plane is grown on the first Group III nitride semiconductor layer under conditions where crystal growth of the Group III nitride semiconductor is permitted, so that spaces between the columns are not filled with the second Group III nitride semiconductor; and a third step subsequent to the second step in which cracking is induced in the first Group III nitride semiconductor layer through lowering of temperature, to thereby separate the second Group III nitride semiconductor layer from the sapphire substrate.

2. A method for producing a Group III nitride semiconductor according to claim 1, wherein the second Group III nitride semiconductor layer is grown to a thickness of 0.5 mm or more.

3. A method for producing a Group III nitride semiconductor according to claim 2, wherein the crystal growth of the Group III nitride semiconductor in the first step is inhibited by adjusting a nitrogen level of the molten mixture to a non-saturation level, and wherein the crystal growth of the Group III nitride semiconductor in the second step is permitted by adjusting the nitrogen level of the molten mixture to a super-saturation level.

4. A method for producing a Group III nitride semiconductor according to claim 2, wherein the crystal growth of the Group III nitride semiconductor in the first step is inhibited by adjusting the pressure to be lower than the pressure at which crystal growth of the Group III nitride semiconductor is permitted, and the crystal growth of the Group III nitride semiconductor in the second step is permitted through elevating a pressure from of the pressure of the first step to the pressure at which crystal growth of the Group III nitride semiconductor is permitted.

5. A method for producing a Group III nitride semiconductor according to claim 4, wherein the molten mixture in the first step has a temperature which is equal to a temperature of the molten mixture of the second step.

6. A method for producing a Group III nitride semiconductor according to claim 2, wherein the crystal growth of the Group III nitride semiconductor in the first step is inhibited by elevating a temperature of the molten mixture to be higher than a temperature at which crystal growth of the Group III nitride semiconductor is permitted, and the crystal growth of the Group III nitride semiconductor in the second step is permitted by lowering the temperature of the molten mixture in the first step to the temperature at which crystal growth of the Group III nitride semiconductor is permitted.

7. A method for producing a Group III nitride semiconductor according to claim 6, wherein the first step employs a pressure which is equal to a pressure of the second step.

8. A method for producing a Group III nitride semiconductor according to claim 1, wherein the crystal growth of the Group III nitride semiconductor in the first step is inhibited by adjusting the pressure to be lower than the pressure at which crystal growth of the Group III nitride semiconductor is permitted, and the crystal growth of the Group III nitride semiconductor in the second step is permitted through elevating a pressure from of the pressure of the first step to the pressure at which crystal growth of the Group III nitride semiconductor is permitted.

9. A method for producing a Group III nitride semiconductor according to claim 8, wherein the molten mixture in the first step has a temperature which is equal to a temperature of the molten mixture of the second step.

10. A method for producing a Group III nitride semiconductor according to claim 1, wherein the crystal growth of the Group III nitride semiconductor in the first step is inhibited by elevating a temperature of the molten mixture to be higher than a temperature at which crystal growth of the Group III nitride semiconductor is permitted, and the crystal growth of the Group III nitride semiconductor in the second step is permitted by lowering the temperature of the molten mixture in the first step to the temperature at which crystal growth of the Group III nitride semiconductor is permitted.

11. A method for producing a Group III nitride semiconductor according to claim 10, wherein the first step employs a pressure which is equal to a pressure of the second step.

12. A method for producing a Group III nitride semiconductor according to claim 1, wherein the crystal growth of the Group III nitride semiconductor in the first step is inhibited by adjusting a nitrogen level of the molten mixture to a non-saturation level, and wherein the crystal growth of the Group III nitride semiconductor in the second step is permitted by adjusting the nitrogen level of the molten mixture to a super-saturation level.

13. A method for producing a Group III nitride semiconductor according to claim 12, wherein the nitrogen level of the molten mixture is adjusted by at least one of a pressure and a temperature of the molten mixture.

14. A method for producing a Group III nitride semiconductor according to claim 13, wherein the non-saturation level of the nitrogen level is adjusted by a pressure lower than a pressure at which crystal growth of the Group III nitride semiconductor is permitted, and wherein the super-saturation level of the nitrogen level is adjusted by elevating the pressure to a pressure at which crystal growth of the Group III nitride semiconductor is permitted.

15. A method for producing a Group III nitride semiconductor according to claim 13, wherein the non-saturation level of the nitrogen level is adjusted by a temperature higher than a temperature at which crystal growth of the Group III nitride semiconductor is permitted, and the super-saturation level of the nitrogen level is adjusted by lowering the temperature to a temperature at which crystal growth of the Group III nitride semiconductor is permitted.

16. A method for producing a Group III nitride semiconductor according to claim 13, wherein the nitrogen level of the molten mixture is further adjusted by melting back the first Group III nitride semiconductor layer.

17. A method for producing a Group III nitride semiconductor according to claim 1, wherein the first Group III nitride semiconductor layer formed on the sapphire substrate comprises a periodic structure of a first portion having poor crystalline quality and a second portion having superior crystalline quality.

18. A method for producing a Group III nitride semiconductor according to claim 17, further comprising a step of forming the template substrate comprising:
- forming a buffer layer on the sapphire substrate;
- forming a base Group III nitride semiconductor layer on the buffer layer;
- forming a periodic pattern mask of the photoresist on a surface of the base Group III nitride semiconductor layer;
- etching the base Group III nitride semiconductor layer and the buffer layer which is not covered with the periodic pattern mask until the sapphire substrate is exposed;
- removing the periodic pattern mask; and
- forming the first Group III nitride semiconductor layer on the surface of the base Group III nitride semiconductor layer and the sapphire substrate.

19. A method for producing a Group III nitride semiconductor according to claim 1, further comprising a step of forming the template substrate comprising:
- forming a buffer layer on the sapphire substrate;
- forming a base Group III nitride semiconductor layer on the buffer layer;
- forming a periodic pattern mask of the photoresist on a surface of the base Group III nitride semiconductor layer;
- etching the base Group III nitride semiconductor layer and the buffer layer which is not covered with the periodic pattern mask until the sapphire substrate is exposed;
- removing the periodic pattern mask; and
- forming the first Group III nitride semiconductor layer on the surface of the base Group III nitride semiconductor layer and the sapphire substrate.

20. A method for producing a Group III nitride semiconductor according to claim 1, wherein, in the first step, forming the plurality of separated upright columns comprises varying a melting back rate by a distribution in Ga concentration in the molten mixture.

* * * * *